(12) United States Patent
Park et al.

(10) Patent No.: US 6,399,457 B2
(45) Date of Patent: Jun. 4, 2002

(54) SEMICONDUCTOR DEVICE HAVING CAPACITOR AND METHOD OF MANUFACTURING THE SAME

(75) Inventors: Byung-lyul Park; Myoung-bum Lee; Hyeon-deok Lee, all of Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/862,733

(22) Filed: May 21, 2001

Related U.S. Application Data

(62) Division of application No. 09/209,651, filed on Oct. 10, 1998, now Pat. No. 6,261,890.

(30) Foreign Application Priority Data

Dec. 11, 1997 (KR) .............................................. 97-67745

(51) Int. Cl.$^7$ ................................................. H01L 21/20
(52) U.S. Cl. ...................... 438/393; 438/238; 438/254; 438/397; 437/60; 437/915; 437/919
(58) Field of Search ................... 438/393, 238, 438/254, 397; 437/60, 915, 919

(56) References Cited

U.S. PATENT DOCUMENTS

| | | | | | |
|---|---|---|---|---|---|
| 5,356,826 | A | * | 10/1994 | Natsume ....................... | 437/60 |
| 5,510,289 | A | * | 4/1996 | Choi ............................ | 437/60 |
| 5,849,618 | A | * | 12/1998 | Jeon ............................ | 438/254 |
| 5,861,332 | A | * | 1/1999 | Yu et al. ..................... | 438/240 |
| 5,970,309 | A | * | 10/1999 | Ha et al. ....................... | 438/3 |
| 6,139,389 | A | * | 10/2000 | Dreyer et al. ................. | 445/35 |
| 6,261,890 | B1 | * | 7/2001 | Park et al. .................. | 438/238 |

* cited by examiner

*Primary Examiner*—Son T. Dinh
*Assistant Examiner*—Pho Luu
(74) *Attorney, Agent, or Firm*—Marger Johnson & McCollom, P.C.

(57) ABSTRACT

A semiconductor device having a capacitor. The capacitor includes a first electrode, a dielectric layer formed of a metal oxide layer including a $Ta_2O_5$ layer, and a second electrode composed of first and second metal nitride layers sequentially stacked. Each of the first and second metal nitride layers has a TiN layer and a WN layer. The second electrode of the capacitor is a double-layered structure having the first and second metal nitride layers, and thus annealing after forming the second electrode is performed at 750° C. or less, to thereby reduce an equivalent oxide thickness of the dielectric layer.

8 Claims, 2 Drawing Sheets

SEMICONDUCTOR DEVICE HAVING CAPACITOR AND METHOD OF MANUFACTURING THE SAME

This application is a divisional of U.S. patent Ser. No. 09/209,651, filed on Oct. 10, 1998, now U.S. Pat. No. 6,261,890, which is herein incorporated by reference in its entirety.

BACKGROUND OF THE INVENTION

1. Field of the Invention

The present invention relates to a semiconductor device and a method of manufacturing the same, and more particularly, to a semiconductor device including a capacitor, and to a method of manufacturing the same.

2. Description of the Related Art

In general, in a semiconductor device, e.g., a DRAM (dynamic random access memory) including a capacitor, as the integration increases, a cell area decreases, and thus an area occupied by the capacitor is reduced. Thus, a method for increasing capacitance must be developed to manufacture a high-integrated semiconductor device.

So as to increase the cell capacitance, a capacitor dielectric layer employs a dielectric layer having a high dielectric constant, e.g., a tantalum oxide ($Ta_2O_5$) layer instead of a silicon nitride layer or a silicon oxide layer. A capacitor employing a tantalum oxide layer as the dielectric layer includes a first electrode and a second electrode formed of polysilicon on the dielectric layer. However, in a structure in which the $Ta_2O_5$ layer contacts with the polysilicon layer, silicon of the polysilicon layer reacts with oxygen of the tantalum oxide layer to form a silicon oxide layer on an interface. Thus, an overall equivalent thickness to $SiO_2$, i.e., a thickness of an effective oxide layer increases, to thereby lower capacitance, and oxygen in the tantalum oxide layer is deficient, to thereby increase leakage current.

Therefore, there has been provided a method of forming the second electrode on the dielectric layer of a high dielectric constant using a metal single layer of WN or TiN. However, when the second electrode is a single layer of WN, step coverage of the WN layer is poor, so that it is difficult to use the WN layer for a high-integrated semiconductor device. Also, when the second electrode is a single layer of TiN, a predetermined thin thickness, e.g., approximately 100 Å is required to reduce the leakage current density. When the TiN layer is approximately 100 Å, a polysilicon layer must be further formed on the TiN layer to be used as an interconnection. In a case that the polysilicon layer is formed on the TiN layer, annealing after forming the polysilicon layer must be performed at 750° C. or higher, e.g., 850° C. Thus, the equivalent oxide thickness of the dielectric layer increases.

Further, the annealing temperature of 750° C. or higher is not desired in the high-integrated semiconductor device.

SUMMARY OF THE INVENTION

To solve the above problems, it is an object of the present invention to provide a semiconductor device having a capacitor.

It is a further object of the present invention to provide a method of manufacturing the semiconductor device.

Accordingly, to achieve the object of the present invention, there is provided a semiconductor device having a capacitor. The capacitor includes a first electrode, a dielectric layer composed of a metal oxide layer including a $Ta_2O_5$ layer, and a second electrode composed of first and second metal nitride layers sequentially stacked. Each of the first and second metal nitride layers is a TiN layer and a WN layer.

To achieve the further object of the present invention, there is provided a method of manufacturing a semiconductor device including a capacitor. By the method, a first electrode of a capacitor is formed on a semiconductor substrate, and a dielectric layer having a metal oxide layer on the first electrode is formed. Then, a first and second metal nitride layers are sequentially formed on the dielectric layer, to thereby form a second electrode of a capacitor composed of the first and second metal nitride layers. Each of the first and second metal nitride layers is a TiN layer and a WN layer.

According to the present invention, the second electrode of the capacitor is a double-layered structure including first and second metal nitride layers so that annealing after forming the second electrode is performed at 750° C. or less, to thereby reduce an equivalent oxide thickness of the dielectric layer.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

Figure 1:
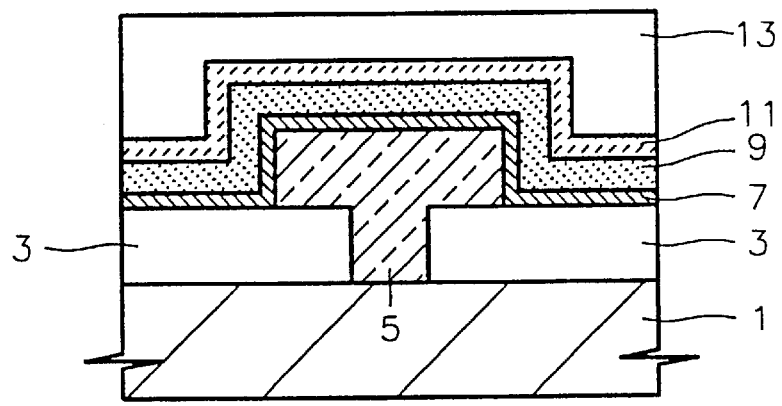
FIG. 1 is a sectional view of a semiconductor device including a capacitor according to the present invention.

Referring to FIG. 1, a semiconductor device includes a first electrode 5 of a capacitor, The first electrode 5 is formed of an impurity-doped polysilicon layer and connected to a semiconductor substrate 1 through a first interlevel dielectric layer 3 having a contact hole. A dielectric layer 7 including a metale oxide layer, e.g., a tantalum oxide ($Ta_2O_5$) layer, is formed on the first electrode 5, and first and second metal nitride layers 9 and 11 are sequentially formed on the dielectric layer 7 to form a second electrode of the capacitor composed of double layers. The first and second metal nitride layers are formed of a TiN layer and a WN layer, respectively. A second interlevel dielectric layer 13 is formed on the second electrode of the capacitor.

FIGS. 2 through 5 are sectional views for illustrating a method of manufacturing a semiconductor device including a capacitor according to the present invention.

Figure 2:
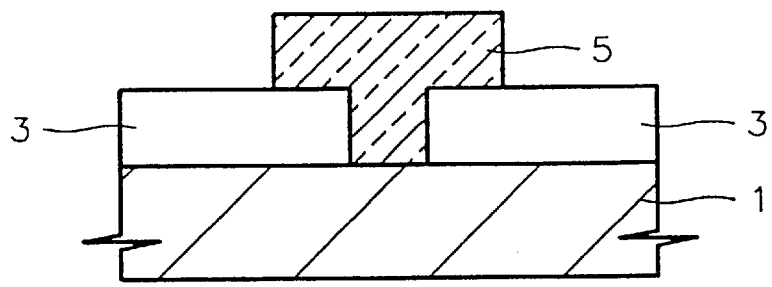
FIGS. 2 through 5 are sectional views for illustrating a method of manufacturing a semiconductor device including a capacitor according to the present invention.

FIG. 2 shows the step of forming a first interlevel dielectric layer 3 and a first electrode 5 of a capacitor.

In detail, the insulating layer is formed on a semiconductor substrate 1 and patterned to form a first interlevel dielectric layer 3 having a contact hole exposing the semiconductor substrate 1. Subsequently, a conductive layer, e.g., a polysilicon layer doped with an impurity is formed to bury the contact hole and patterned to form the first electrode 5 of the capacitor. Here, the impurity is arsenic (As) or phosphorus (P).

Figure 3:
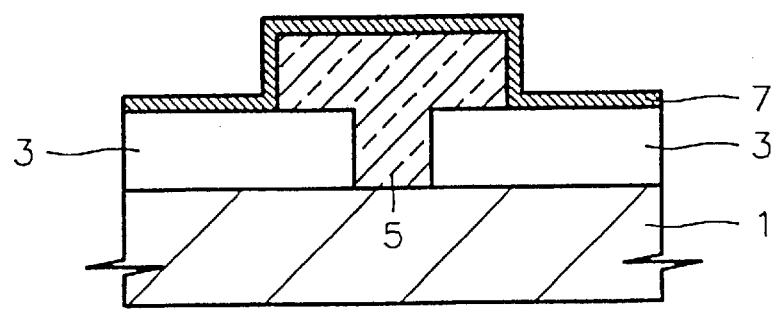

FIG. 3 shows the step of forming a dielectric layer 7.

In detail, the dielectric layer 7 having a high dielectric constant, e.g., a $Ta_2O_5$ layer is formed on the entire surface of the semiconductor substrate 1 with a thickness of 30~200

Å. Thus, the dielectric layer 7 is formed around the first electrode 5 of the capacitor and on the first interlevel dielectric layer 3.

Figure 4:
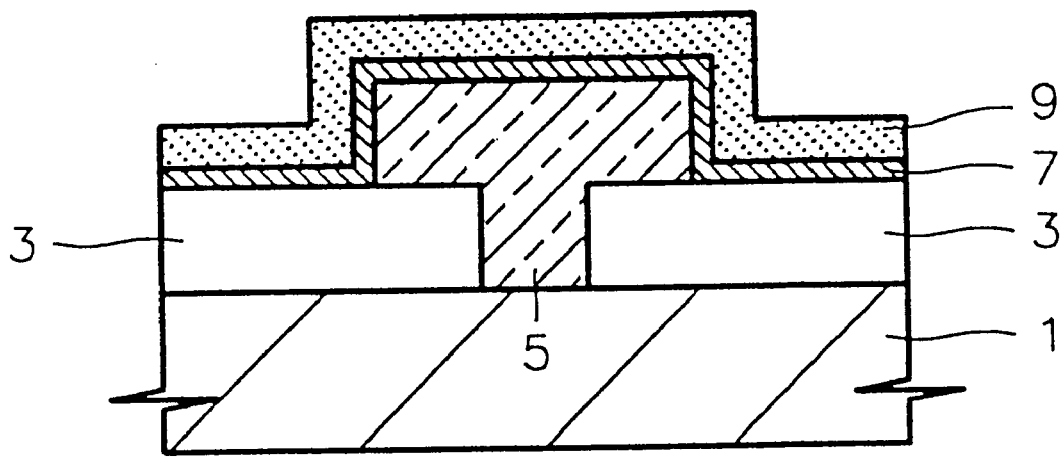

FIG. 4 shows the step of forming a first metal nitride layer 9.

In detail, the first metal nitride layer 9 is formed on the dielectric layer 7. Here, the first metal nitride layer 9 employing a TiN layer is formed at 600~700° C. with a thickness of 10~1000 Å using a chemical vapor deposition (CVD) method. Here, the first metal nitride layer 9 is formed using a chemical vapor deposition (CVD) method because of excellent step coverage. The thickness of the TiN layer used for the first metal nitride layer 9 can be variously formed by the second metal nitride layer to be formed. That is, the thickness of the TiN layer may be higher or lower compared to 100 Å thickness used in the conventional art.

Figure 5:
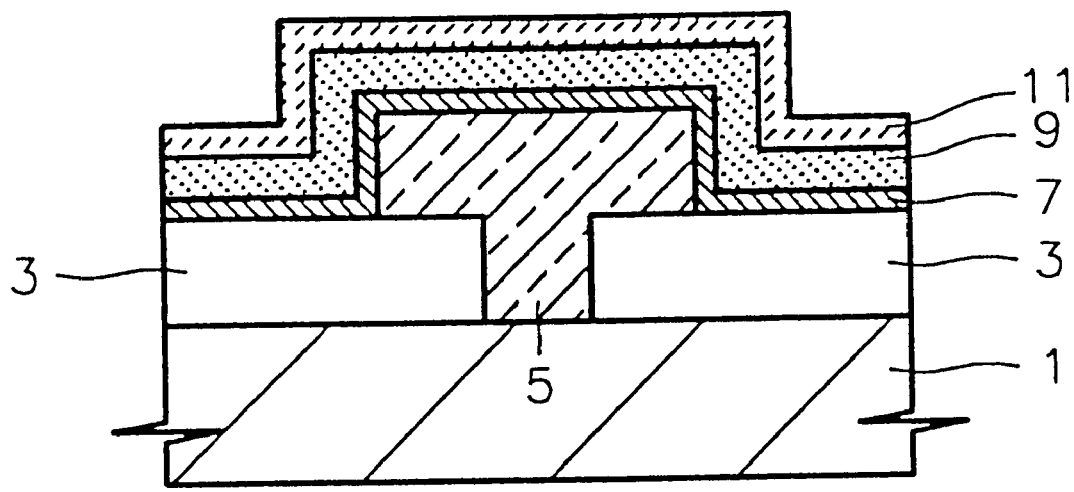

FIG. 5 shows the step of forming a second metal nitride layer 11.

In detail, the second metal nitride layer 11 is formed on the first metal nitride layer 9 by the CVD method, particularly a plasma enhanced CVD (PECVD) method. Here, the second metal nitride layer is formed of a WN layer, at 300~400° C. to 100~1000 Å. Since a formation temperature is low and the step coverage is good, the second metal nitride layer 11 is formed by the CVD method. The first and second metal nitride layers 9 and 11 as double layers become a second electrode of the capacitor.

When the second electrode of the capacitor are double-layered, i.e., have a TiN layer and a WN layer, the annealing after forming the WN layer may be performed at 750° C. or less, since a polysilicon layer is not formed as the conventional art. Thus, an equivalent oxide thickness of a dielectric layer 7 is reduced, so that the capacitance increases and it is advantageous to a high-integrated semiconductor device manufactured at a lower temperature.

It should be understood that the invention is not limited to the illustrated embodiment and that many changes and modifications can be made within the scope of the invention by a person skilled in the art.

What is claimed is:

1. A method of manufacturing a semiconductor device, comprising the steps of:
    forming a first electrode of a capacitor on a semiconductor substrate;
    forming a dielectric layer having a metal oxide layer on the first electrode; and
    sequentially forming first and second metal nitride layers on the dielectric layer to form a second electrode of a capacitor composed of the first and second metal nitride layers.

2. The method of claim 1, wherein the first and second metal nitride layers are formed by depositing a TiN layer and a WN layer.

3. The method of claim 2, in which the TiN layer is deposited to a thickness of about 10–1,000 Å and the WN layer is deposited to a thickness of about 100–1000 Å.

4. The method of claim 1, wherein the metal oxide layer is a $Ta_2O_5$ layer.

5. The method of claim 1, wherein forming the first and second metal nitride layers further comprises a chemical vapor deposition (CVD) method.

6. The method of claim 1, further comprising a step of annealing, wherein said annealing is performed at 750° C. or less.

7. The method of claim 1, wherein the metal oxide layer is a $Ta_2O_5$ layer, and wherein the first and second metal nitride layers are formed by depositing a TiN layer and a WN layer on the $Ta_2O_5$ layer.

8. The method of claim 7 in which the $Ta_2O_5$ layer has an as-deposited thickness in the range of 30–200 Å, and device is annealed at a temperature up to 750° C. after deposition of the TiN and WN layers, the $Ta_2O_5$ layer retaining substantially said as-deposited thickness after annealing.

* * * * *